US011721582B2

(12) United States Patent
Gardner et al.

(10) Patent No.: US 11,721,582 B2
(45) Date of Patent: Aug. 8, 2023

(54) METHOD OF MAKING 3D CIRCUITS WITH INTEGRATED STACKED 3D METAL LINES FOR HIGH DENSITY CIRCUITS

(71) Applicant: Tokyo Electron Limited, Tokyo (JP)

(72) Inventors: Mark I. Gardner, Cedar Creek, TX (US); H. Jim Fulford, Marianna, FL (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/557,561

(22) Filed: Dec. 21, 2021

(65) Prior Publication Data

US 2022/0115271 A1 Apr. 14, 2022

Related U.S. Application Data

(62) Division of application No. 16/848,213, filed on Apr. 14, 2020, now Pat. No. 11,251,080.
(Continued)

(51) Int. Cl.
*H01L 21/768* (2006.01)
*H01L 21/306* (2006.01)
(Continued)

(52) U.S. Cl.
CPC .. *H01L 21/76898* (2013.01); *H01L 21/30608* (2013.01); *H01L 21/76831* (2013.01);
(Continued)

(58) Field of Classification Search
CPC ........... H01L 21/30608; H01L 21/8221; H01L 21/823475; H01L 21/823871
See application file for complete search history.

(56) References Cited

U.S. PATENT DOCUMENTS 9,018,692 B2 4/2015 Lung
9,331,272 B2 5/2016 Hwang et al.
(Continued)

FOREIGN PATENT DOCUMENTS

KR 10-2012-0136963 A 12/2012

OTHER PUBLICATIONS

International Search Report and Written Opinion dated Mar. 5, 2021 in PCT/US2020/059848, 10 pages.

*Primary Examiner* — Bac H Au
(74) *Attorney, Agent, or Firm* — Oblon, McClelland, Maier & Neustadt, L.L.P.

(57) ABSTRACT

Techniques herein include methods for fabricating three-dimensional (3D) logic or memory stack integrated with 3D metal routing. The methods can include stacking metal layers within existing 3D silicon stacks. A first portion can be masked while a second, uncovered portion is etched. Predetermined layers in a bottom portion (disposed closer to the substrate) of the multilayer stack can be replaced with a conductor. The second portion can be masked while the first portion is uncovered and processed. This can enable higher density 3D circuits by having multiple metal lines contained within a multilayer 3D nano-sheet. Advantageously, this facilitates easier connections for 3D logic and memory. Moreover, better speed performance can be achieved by having reduced distance for signals to travel to transistor connections.

13 Claims, 12 Drawing Sheets

Related U.S. Application Data (60) Provisional application No. 62/942,316, filed on Dec. 2, 2019.

(51) Int. Cl.
  *H01L 23/48* (2006.01)
  *H01L 21/822* (2006.01)
  *H01L 23/532* (2006.01)

(52) U.S. Cl.
  CPC .... *H01L 21/76877* (2013.01); *H01L 21/8221* (2013.01); *H01L 23/481* (2013.01); *H01L 23/53257* (2013.01)

(56) References Cited

U.S. PATENT DOCUMENTS

| | | | |
|---|---|---|---|
| 9,735,203 B2 | 8/2017 | Hwang et al. | |
| 9,947,664 B1 | 4/2018 | Anderson et al. | |
| 9,997,598 B2 | 6/2018 | Smith et al. | |
| 10,236,217 B1 | 3/2019 | Ando | |
| 10,388,664 B2 | 8/2019 | Huang | |
| 10,453,850 B2 | 10/2019 | Smith et al. | |
| 10,529,830 B2 | 1/2020 | Tapily et al. | |
| 10,573,655 B2 | 2/2020 | Smith et al. | |
| 10,607,992 B2 | 3/2020 | Anderson et al. | |
| 10,748,901 B2 | 8/2020 | Rubin | |
| 10,756,174 B2 | 8/2020 | Van Dal | |
| 11,171,208 B2 * | 11/2021 | Fulford | H01L 21/823475 |
| 2013/0119455 A1 | 5/2013 | Chen | |
| 2014/0124729 A1 | 5/2014 | Hwang et al. | |
| 2016/0225825 A1 | 8/2016 | Hwang et al. | |
| 2018/0026042 A1 | 1/2018 | Smith et al. | |
| 2018/0040695 A1 | 2/2018 | Smith et al. | |
| 2018/0047832 A1 | 2/2018 | Tapily et al. | |
| 2018/0090624 A1 | 3/2018 | Cheng | |
| 2018/0108659 A1 | 4/2018 | Anderson et al. | |
| 2018/0114834 A1 | 4/2018 | Cheng | |
| 2018/0122807 A1 | 5/2018 | Anderson et al. | |
| 2018/0175167 A1 | 6/2018 | Reboh | |
| 2018/0240802 A1 | 8/2018 | Smith et al. | |
| 2018/0315794 A1 | 11/2018 | Kamalanathan et al. | |
| 2019/0097011 A1 | 3/2019 | Wu | |
| 2019/0131126 A1 | 5/2019 | Ko et al. | |
| 2019/0131394 A1 * | 5/2019 | Reznicek | H01L 21/30604 |
| 2019/0172755 A1 | 6/2019 | Smith | |
| 2019/0326301 A1 | 10/2019 | Smith et al. | |
| 2020/0098897 A1 | 3/2020 | Tapily et al. | |
| 2020/0105751 A1 * | 4/2020 | Dewey | H01L 27/092 |
| 2020/0118892 A1 | 4/2020 | Cheng | |
| 2020/0168608 A1 | 5/2020 | Anderson et al. | |
| 2020/0328210 A1 | 10/2020 | Wu | |
| 2020/0403034 A1 * | 12/2020 | Ando | H01L 45/08 |
| 2021/0175128 A1 | 6/2021 | Gardner | |

* cited by examiner

METHOD OF MAKING 3D CIRCUITS WITH INTEGRATED STACKED 3D METAL LINES FOR HIGH DENSITY CIRCUITS

CROSS REFERENCE TO RELATED APPLICATIONS

This application is a divisional of U.S. patent application Ser. No. 16/848,213 filed on Apr. 14, 2020, which is based upon and claims the benefit of U.S. Provisional Application No. 62/942,316, filed on Dec. 2, 2019, the entire contents of each of which are incorporated herein by reference in its entirety.

FIELD OF THE INVENTION

The present disclosure relates to a method of fabrication for integrated circuits and microelectronic devices, specifically for multiple integrated stacked 3D metal lines in high density circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscopic scale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies.

SUMMARY

The present disclosure relates to a method of fabricating a semiconductor device, the method including: masking, along a length dimension of a multilayer stack, a first portion of the multilayer stack on a substrate while at least a second portion is uncovered, the multilayer stack including an elongated geometry along the length dimension and perpendicular to a vertical direction, a width dimension perpendicular to the vertical direction and the length dimension, at least four materials, a lower portion including at least one layer of a first material in contact and alternating with at least one layer of a second material, and an upper portion including at least one layer of a third material in contact and alternating with at least one layer of a fourth material, each of the at least four materials having a different etch resistivity relative to each other; replacing uncovered layers of the first material in the second portion with a conductor; replacing uncovered layers of the second material in the second portion with a dielectric; masking, along the length dimension, the second portion of the multilayer stack while at least the first portion is uncovered; replacing uncovered layers of the first material in the first portion with the conductor; and replacing uncovered layers of the second material in the first portion with the dielectric.

The disclosure additionally relates to a method of fabricating a semiconductor device, including: depositing a dielectric material over a multilayer stack, the multilayer stack including an elongated geometry along a length dimension and perpendicular to a vertical direction, a width dimension perpendicular to the vertical direction and the length dimension, at least four materials, a lower portion including at least one layer of a first material in contact and alternating with at least one layer of a second material, and an upper portion including at least one layer of a third material in contact and alternating with at least one layer of a fourth material, each of the at least four materials having a different etch resistivity relative to each other; forming an etch mask over a first portion of the multilayer stack along the length dimension; etching a second portion of the multilayer stack not covered by the etch mask to uncover layers in the second portion of the multilayer stack; etching uncovered layers of the first material in the second portion; filling the etched layers of the first material with a conductor; etching uncovered layers of the second material in the second portion; filling the etched layers of the second material with the dielectric; depositing the dielectric material over the multilayer stack; forming an etch mask over the second portion of the multilayer stack along the length dimension; etching the first portion of the multilayer stack not covered by the etch mask to uncover layers in the first portion of the multilayer stack; etching uncovered layers of the first material in the first portion; filling the etched layers of the first material with the conductor; etching uncovered layers of the second material in the first portion; filling the etched layers of the second material with the dielectric; and forming metal lines from each of the at least one layer of the first material replaced by the conductor.

The disclosure additionally relates to a semiconductor device, including: a substrate; an oxide layer deposited on the substrate; a multilayer stack formed on top of the oxide layer, the multilayer stack including an elongated geometry along a length dimension and perpendicular to a vertical direction, a width dimension perpendicular to the vertical direction and the length dimension, at least four materials, a lower portion including at least one layer of a first material in contact and alternating with at least one layer of a second material, and an upper portion including at least one layer of a third material in contact and alternating with at least one layer of a fourth material, each of the at least four materials having a different etch resistivity relative to each other; and a nitride cap formed on top of the multilayer stack.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein provide methods and devices for fabricating three-dimensional (3D) logic or memory stack integrated with 3D metal routing. Metal routing and connections for 3D logic and memory is one challenge to resolve in order to form the desired multiple metal connections. Techniques herein can solve this challenge by providing a method to stack metal layers within existing 3D silicon stacks. This can enable higher density 3D circuits to be produced at reduced cost. By having multiple metal lines contained within a 3D nano-sheet, this design enables easier connections for 3D logic and memory. Moreover, better speed performance can be achieved by having reduced distance for signals to travel to transistor connections compared to other designs.

Also, there is improved scaling of circuits. For example, metal routing can go through a 3D transistor stack. Embodiments described herein show, for example, two metal connection lines as an example in a base of a 3D epitaxially-grown nano-sheet stack. It can be appreciated that any number of metal lines can be contemplated. Embodiments herein include integrated flows enabling multiple metal lines to be isolated with a dielectric within a self-contained 3D silicon and 3D metal layout network.

Figure 1:
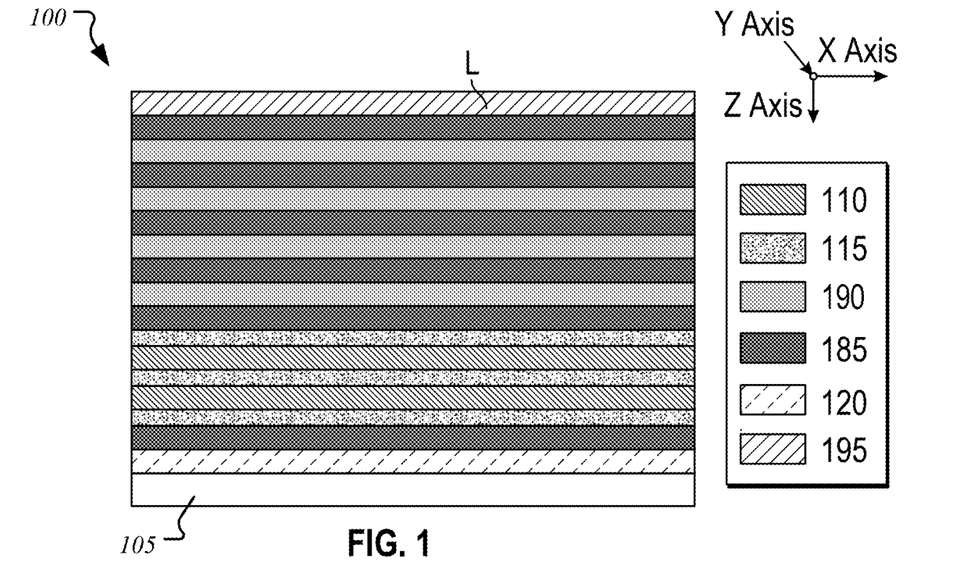
FIG. 1 is a cross-sectional front view of a substrate segment showing an example result of a multilayer stack of layers or nanolayers along a length dimension, according to an embodiment of the present disclosure.

FIG. 1 is a cross-sectional front view of a substrate 105 segment showing an example result of a multilayer stack 100 of layers or nanolayers along a length dimension, according to an embodiment of the present disclosure. In an embodiment, the substrate 105 can include one or multiple stacks 100. The stack 100 can include a length L that describes the length of the nano-sheet stack 100. The stack 100 can be, for example, a fin shaped structure. The stack 100 can include additional layers of material, such as a cap 195, a first channel material 190, and a sacrificial material 185. For example, the cap 195 can be a nitride cap, the first channel material 190 can be silicon, and the sacrificial material 185 can be silicon germanium (SiGe2). In one embodiment, as shown in the figures, the stack 100 can include five layers of the sacrificial material 185 alternating with four layers of the first channel material 190 towards a top, or an upper portion, of the stack 100 (with an additional layer of the sacrificial material 185 towards a bottom of the stack 100).

Figure 2:
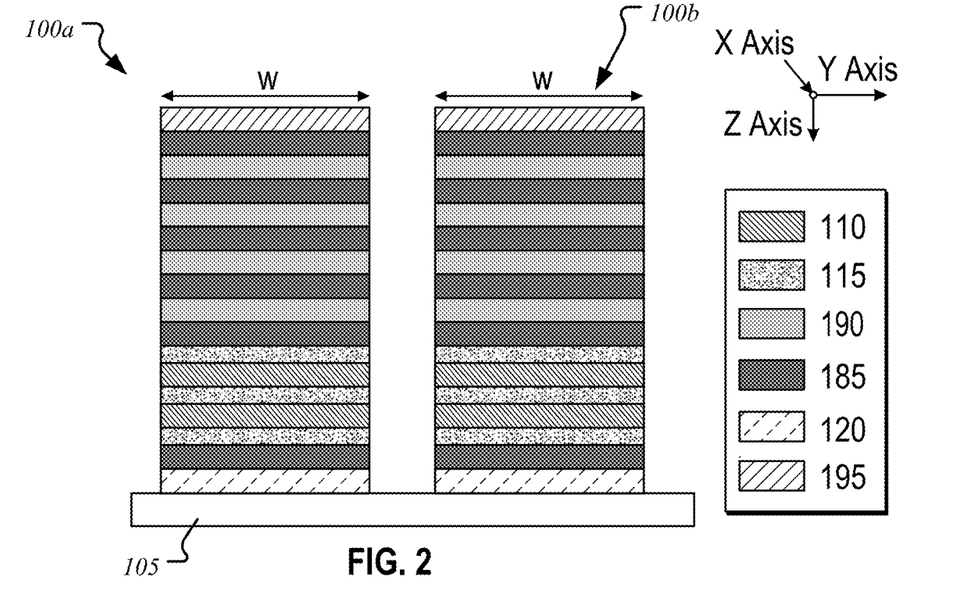
FIG. 2 is a cross-sectional side view of a substrate segment showing an example result of a stack of layers or nanolayers along a width dimension, according to an embodiment of the present disclosure.

FIG. 2 is a cross-sectional side view of the substrate 105 segment showing an example result of the stack 100 of layers or nanolayers along a width dimension, according to an embodiment of the present disclosure. In an embodiment, the substrate 105 includes two adjacent stacks, for example a first stack 100a and a second stack 100b, each of which can include a width W. Notably, the width W can vary among stacks 100a, 100b. The length L can similarly vary among stacks 100a, 100b. As shown, the stacks 100a, 100b can include a plurality of SiX4 110 layers within the bases of the 3D silicon plane nano-sheet stacks 100, which can be eventually replaced with a metal layer. The stacks 100a, 100b can include a plurality of SiX5 115 layers within the bases of the 3D silicon plane nano-sheet stacks 100, which can be eventually replaced with an oxide layer. In one embodiment, as shown in the figures, the stack 100 can include two layers of the SiX4 110 alternating with three layers of the SiX5 115 towards a bottom, or a lower portion, of the stack 100. Notably, the ability to etch and replace multiple layers of the SiX4 110 and the SiX5 115 can allow for more eventual metal lines and increase device density. Furthermore, the location of the SiX4 110 in the bottom portion, and eventual conductive material that replaces the SiX4 110, can advantageously allow for easier fabrication of the metal lines and their connections to other features in the final device.

It can be appreciated that other materials can be used, for example GeX4 and GeX5 for the SiX4 110 and the SiX5 115. The layers in the stacks 100 can be grown with different variations of silicon. The SiX4 110 and SiX5 115 materials can be interchangeable, but once one is fixed the other would have different selectivity. This is typically a different chemical compound, but can also be different orientations of a same compound. For example, materials for SiX4 and SiX5 can include $Si_xGe_y$ with x ranging from 0.10 to 0.25 and y ranging from 0.75 to 0.90. Other selectable compounds include, for example, germanium, $Ge_xSn_y$, and $Si_xC_y$, among others.

Note that the y-axis runs into and out of the plane of FIG. 1, and the x-axis runs into and out of the plane of FIG. 2. Thus, FIG. 2 shows a rotated FIG. 1 with the vertical axis or z-axis as the rotation axis, wherein the first stack 100a is blocking the view of the second stack 100b in FIG. 1.

Figure 3:
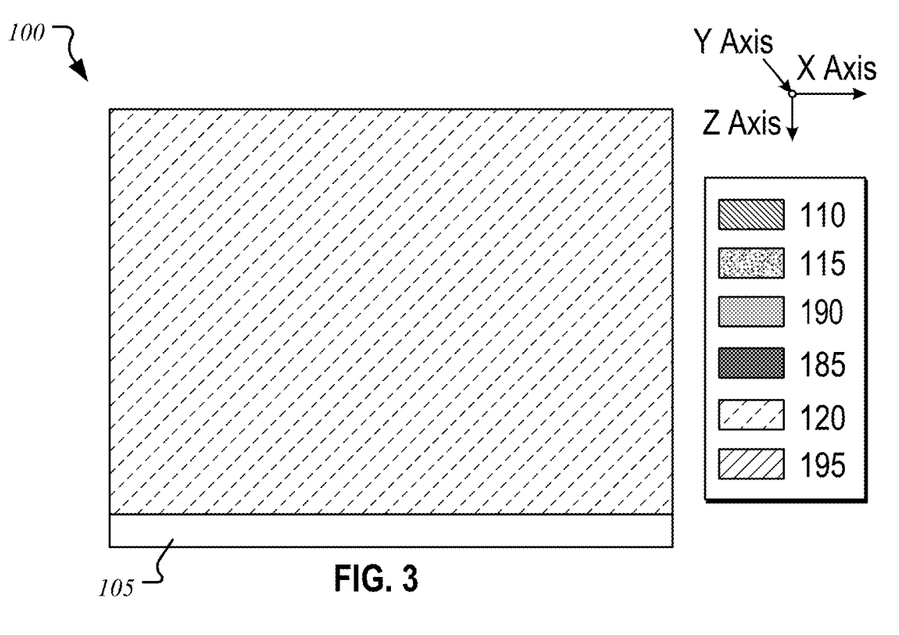
FIG. 3 is a cross-sectional front view of a substrate segment showing an example result of a stack of layers or nanolayers with a dielectric fill, according to an embodiment of the present disclosure.

FIG. 3 is a cross-sectional front view of the substrate 105 segment showing an example result of the stack 100 of layers or nanolayers with a dielectric fill, according to an embodiment of the present disclosure. In an embodiment, the dielectric fill, or an oxide 120, is deposited on the substrate 105. For example, the oxide 120 is deposited on the substrate 105 to fill any openings present.

Figure 4:
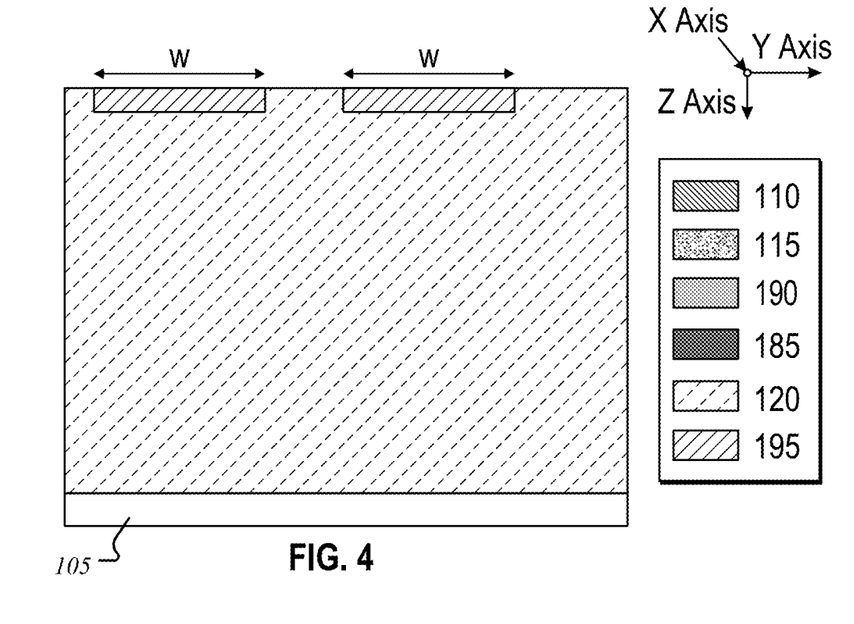
FIG. 4 is a cross-sectional side view of a substrate segment showing an example result of a stack of layers or nanolayers with a planarized dielectric fill, according to an embodiment of the present disclosure.

FIG. 4 is a cross-sectional side view of the substrate 105 segment showing an example result of the stack 100 of layers or nanolayers with a planarized dielectric fill, according to an embodiment of the present disclosure. In an embodiment, an extra amount of the oxide 120 can be removed by, for example, chemical-mechanical polishing (CMP) to planarize a top surface of the stacks 100. Other planarization methods are known and can also be used.

Figure 5:
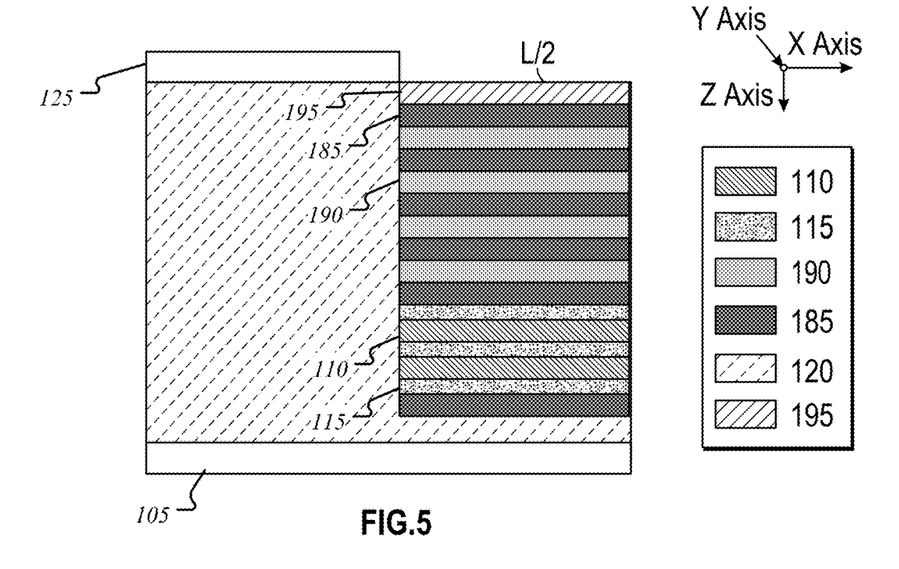
FIG. 5 is a cross-sectional front view of a substrate segment showing an example result of a stack of layers or nanolayers including an etch mask, according to an embodiment of the present disclosure.

FIG. 5 is a cross-sectional front view of the substrate 105 segment showing an example result of the stack 100 of layers or nanolayers including an etch mask 125, according to an embodiment of the present disclosure. In an embodiment, the etch mask 125 can be formed to cover a portion on one side of the nano-sheet stack 100. FIG. 5 shows the etch mask 125 covering approximately half of the nano-sheet stack 100 length. It can be appreciated that a span of the etch mask 125 can be less than half the length (L/2) given that the cantilever effect does not cause the uncovered layers in the stack 100 to bow or result in stiction (adhesion forces between fabricated structures and the substrate) during subsequent processing steps. Similarly, the span can be more than half the length (L/2) as well. That is to say, more than two cycles of the method can be used to fully etch and fill all the desired layers. For example, the etch mask 125 can cover a third of the length (L/3) and the method can take three cycles to fully etch and fill all the desired layers. The un-masked side is then etched to remove the oxide 120 and uncover the layers in the stack 100.

Figure 6:
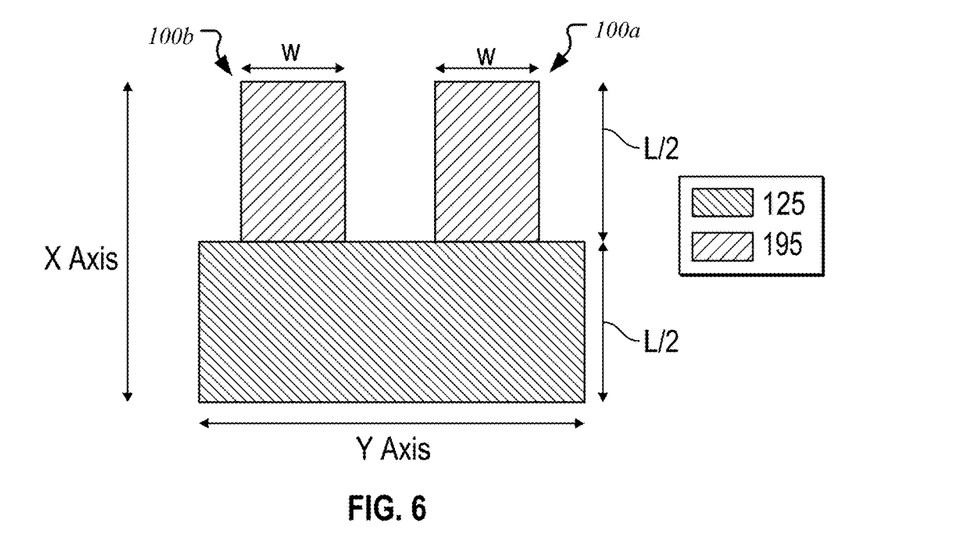
FIG. 6 is a top-view with an uncovered oxide having been etched, according to an embodiment of the present disclosure.

FIG. 6 is a top-view with the uncovered oxide 120 having been etched, according to an embodiment of the present disclosure. In an embodiment, the etch uncovers sidewalls of the nano-sheet stack 100. For example, the etch can be a vapor-phase or wet chemical etch having selectivity to one of the materials in the stack 100. The etch mask 125 can be replicated to integrate x-direction spans that are relatively long. The nano-sheet stacks 100a, 100b are shown with width and length dimensions.

Figure 7:
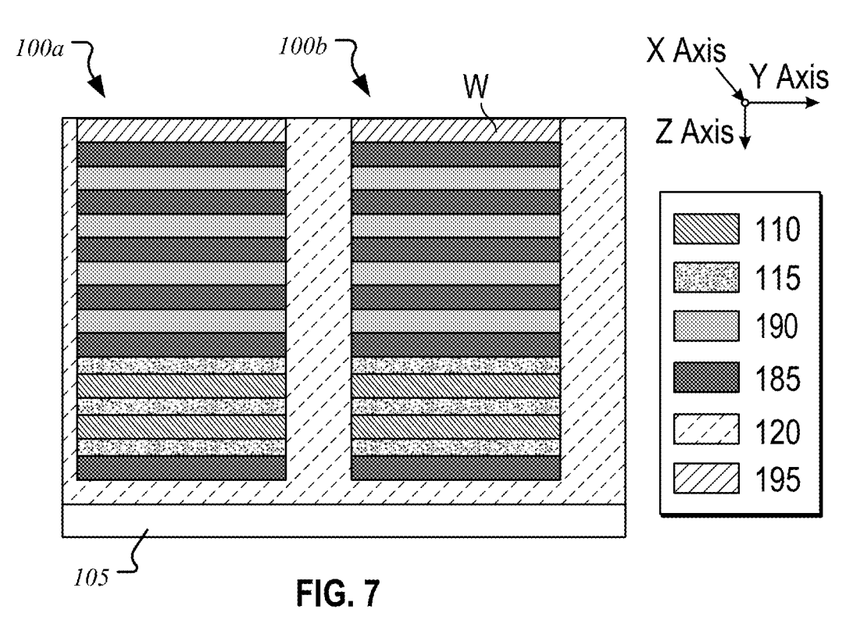
FIG. 7 is a cross-sectional side view with an uncovered oxide having been etched, according to an embodiment of the present disclosure.

FIG. 7 is a cross-sectional side view with the uncovered oxide 120 having been etched, according to an embodiment of the present disclosure. Note that the oxide 120 is recessed in this view and the etch mask can be removed.

Figure 8:
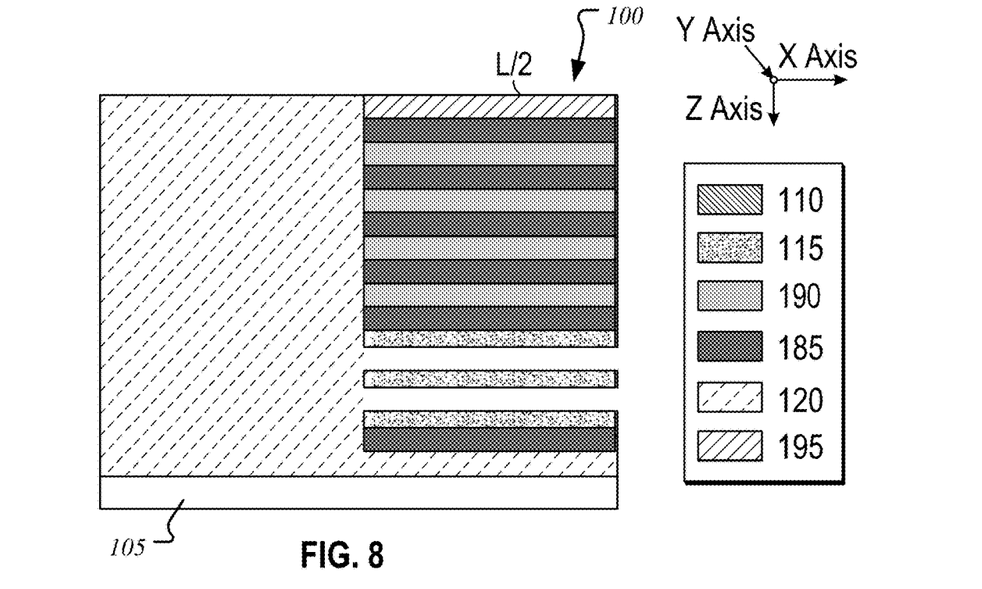
FIG. 8 is a cross-sectional front view of a substrate segment showing an example result of a stack of layers or nanolayers after a first etch, according to an embodiment of the present disclosure.
Figure 9:
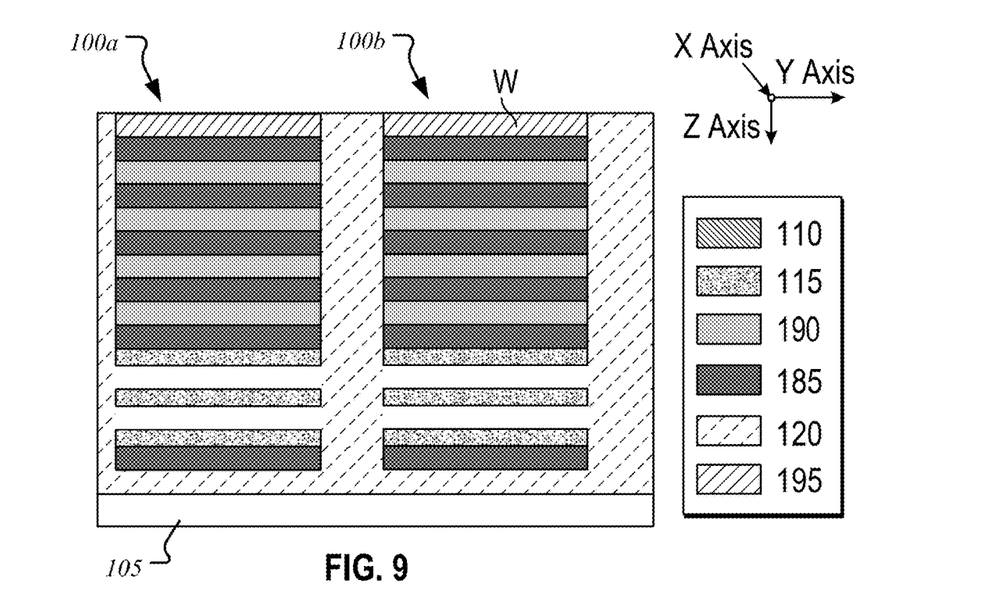
FIG. 9 is a cross-sectional side view of a substrate segment showing an example result of a stack of layers or nanolayers after a first etch, according to an embodiment of the present disclosure.

FIG. 8 is a cross-sectional front view of the substrate 105 segment showing an example result of the stack 100 of layers or nanolayers after a first etch, according to an embodiment of the present disclosure. FIG. 9 is a cross-sectional side view of the substrate 105 segment showing an example result of the stack 100 of layers or nanolayers after the first etch, according to an embodiment of the present disclosure. The first etch can be executed to etch one material in the stack 100 without etching other materials. In an example, the first etch can include an isotropic etch to evenly etch the first channel material 190 in any direction, wherein the first channel material 190 is silicon. For example, an isotropic, vapor-phase etch having an etch selectivity of 100:1 to other materials in other layers, such as SiGe or doped Si, can be used. As described above, a vapor-phase etch, chemical oxide removal etch, atomic layer etch (ALE) or quasi-ALE etch can be executed. Accordingly, the first etch results in a lateral etch because sidewalls of the layers in the uncovered portion of the stack 100 are uncovered. This selective etch can laterally remove all or a portion of a given material that is etchable by the particular etchants and process conditions used (chemical compounds, chamber pressure, temperature, etc.). In an embodiment, the uncovered SiX4 110 can be removed using, for example, the first etch, wherein the first channel material 190 is silicon, the SiX4 110 is SiN, and the SiX5 115 is SiO. It can be appreciated that myriad etch chemistries for etching/removing materials herein are known or are available in various etch tables. For example, the first etch to remove SiX4 110 (and SiX5 115) materials include vapor HCl and diluted HCl, wet NH4OH:H2O, wet H2O2, and wet (CrO3-H2O)/ Hf, among others.

Notably, after the first etch and removal of the SiX4 110, the layers that were previously supported by the SiX4 110 are subsequently "floating" as they protrude from a side of the oxide 120 that covers the previously masked portion of the stack 100. The length of these floating, protruding layers is shown as L/2, but as previously described, can be any predetermined length as long as the cantilever effect and stiction do not cause the layers to come into contact or bow sufficiently during subsequent processing to affect final device performance.

Figure 10:
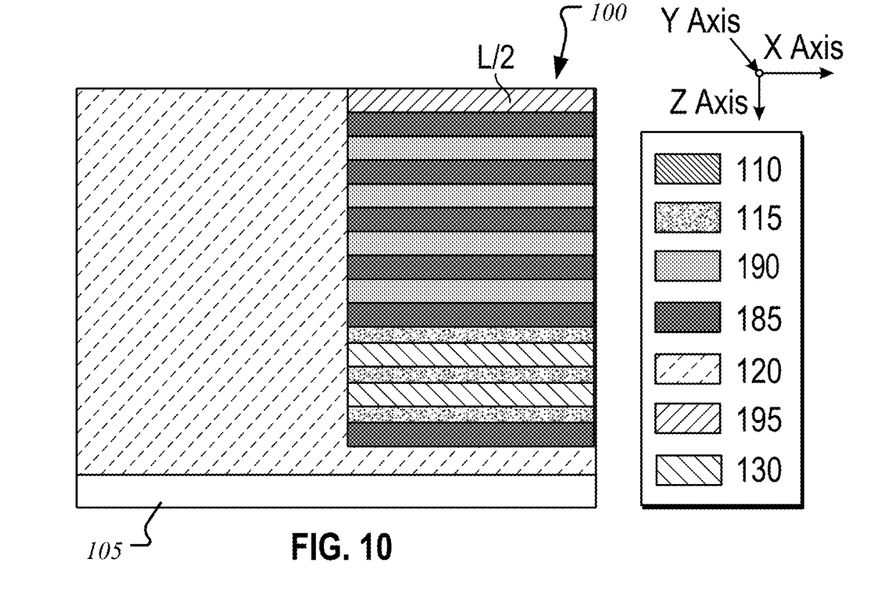
FIG. 10 is a cross-sectional front view of a substrate segment showing an example result of a stack of layers or nanolayers after a metal deposition, according to an embodiment of the present disclosure.
Figure 11:
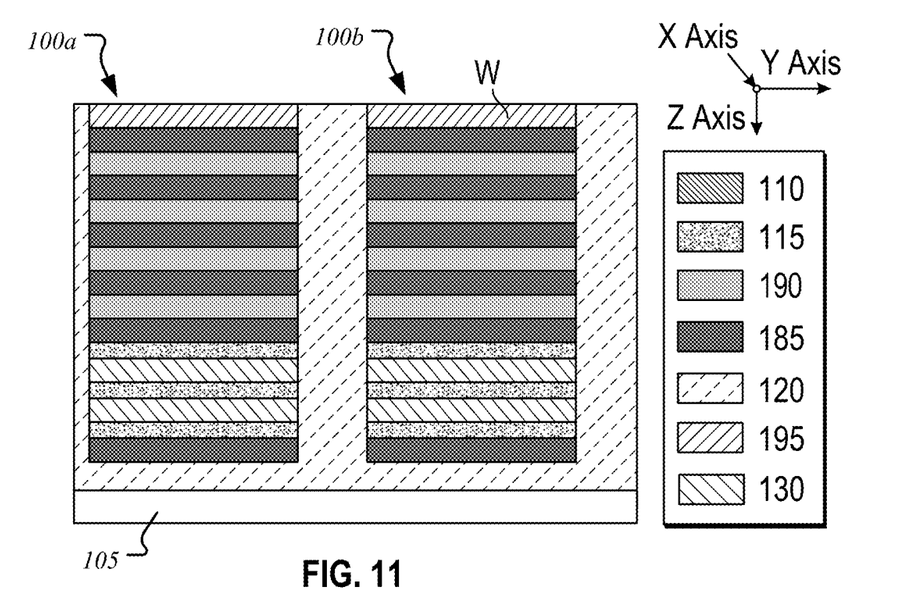
FIG. 11 is a cross-sectional side view of a substrate segment showing an example result of a stack of layers or nanolayers after a metal deposition, according to an embodiment of the present disclosure.

FIG. 10 is a cross-sectional front view of the substrate 105 segment showing an example result of the stack 100 of layers or nanolayers after a metal deposition, according to an embodiment of the present disclosure. FIG. 11 is a cross-sectional side view of the substrate 105 segment showing an example result of the stack 100 of layers or nanolayers after the metal deposition, according to an embodiment of the present disclosure. In an embodiment, the deposition of a metal 130 can be executed followed by an etch to align an edge of the metal 130 layer with an edge of the nano-sheet stack 100. In an embodiment, using a nitride mask can enable a self-aligned etch. For example, the metal 130 can be ruthenium (Ru) and deposited in the space formerly occupied by the SiX4 110, and then trimmed to be flush with the nano-sheet stack 100. For example, a directional etch can be performed, such as a reactive ion etch.

Figure 12:
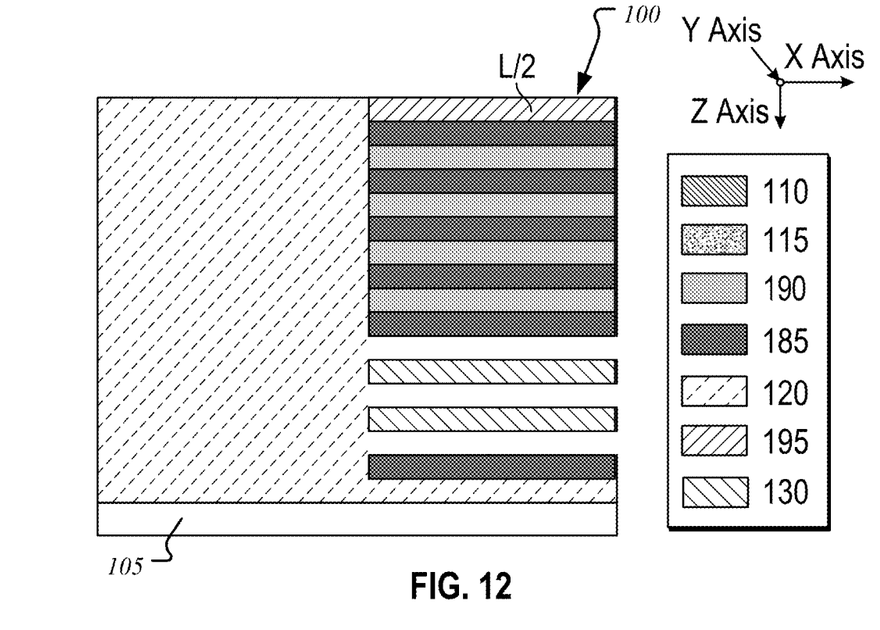
FIG. 12 is a cross-sectional front view of a substrate segment showing an example result of a stack of layers or nanolayers after a second etch, according to an embodiment of the present disclosure.
Figure 13:
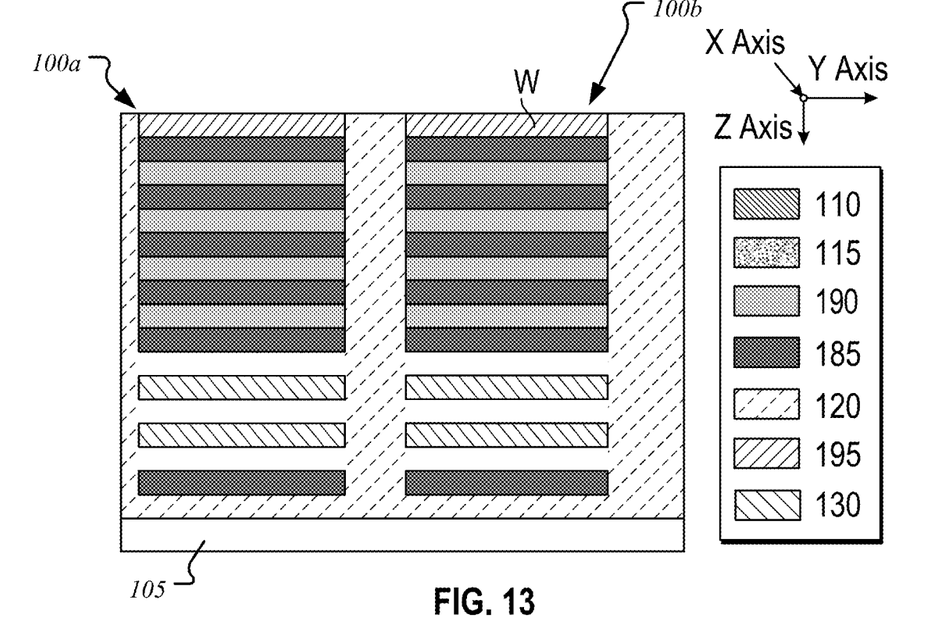
FIG. 13 is a cross-sectional side view of a substrate segment showing an example result of a stack of layers or nanolayers after a second etch, according to an embodiment of the present disclosure.

FIG. 12 is a cross-sectional front view of the substrate 105 segment showing an example result of the stack 100 of layers or nanolayers after a second etch, according to an embodiment of the present disclosure. FIG. 13 is a cross-sectional side view of the substrate 105 segment showing an example result of the stack 100 of layers or nanolayers after the second etch, according to an embodiment of the present disclosure. In an embodiment, the uncovered SiX5 115 can be removed using the second etch. Similar to removing the SiX4 110, the second etch can be performed with similar parameters and chemistries as the first etch to remove the SiX5 115. In the case where the SiX5 is a different material with different selectivity to etching as compared to the SiX4 110, an alternative etch chemistry can be used.

Figure 14:
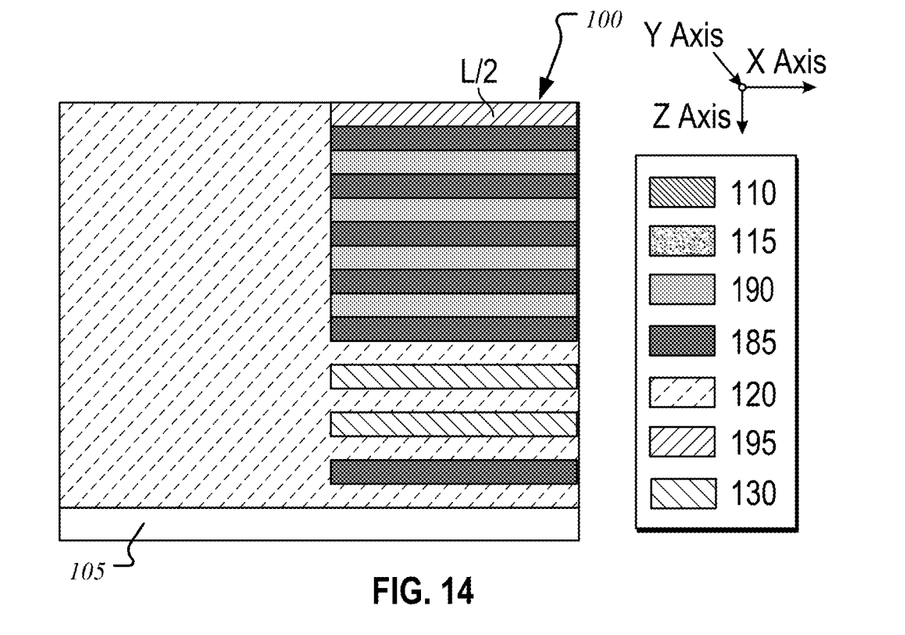
FIG. 14 is a cross-sectional front view of a substrate segment showing an example result of a stack of layers or nanolayers after a deposition of an oxide, according to an embodiment of the present disclosure.
Figure 15:
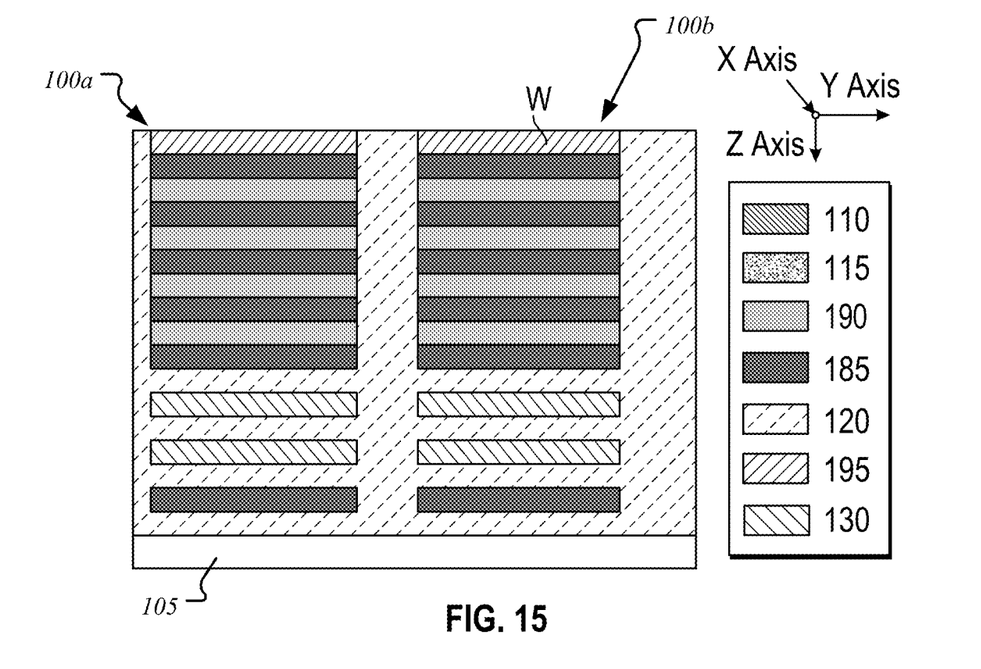
FIG. 15 is a cross-sectional side view of a substrate segment showing an example result of a stack of layers or nanolayers after a deposition of an oxide, according to an embodiment of the present disclosure.

FIG. 14 is a cross-sectional front view of the substrate 105 segment showing an example result of the stack 100 of layers or nanolayers after a deposition of the oxide 120, according to an embodiment of the present disclosure. FIG. 15 is a cross-sectional side view of the substrate 105 segment showing an example result of the stack 100 of layers or nanolayers after the deposition of the oxide 120, according to an embodiment of the present disclosure. In an embodiment, the oxide 120 deposition step can be performed to fill the space formerly occupied by the SiX5 115. Notably, other dielectric materials can be used to fill the space. This, in turn, can isolate lines of the metal 130 from future silicon channel regions. With half of the stack 100 processed, the other half may subsequently be subject to the same processing steps.

Figure 16:
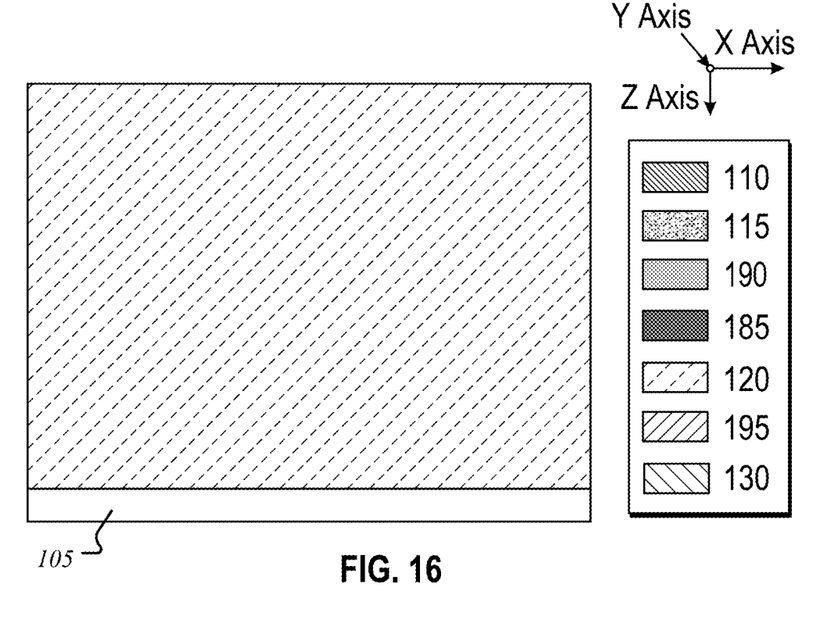
FIG. 16 is a cross-sectional front view of a substrate segment showing an example result of a stack of layers or nanolayers with a dielectric fill, according to an embodiment of the present disclosure.

FIG. 16 is a cross-sectional front view of the substrate 105 segment showing an example result of the stack 100 of layers or nanolayers with a dielectric fill, according to an embodiment of the present disclosure. In an embodiment, the oxide 120 is deposited to cover the stack 100 and substrate 105 again. Similarly, this can be followed by CMP to planarize the top surface of the stack 100.

Figure 17:
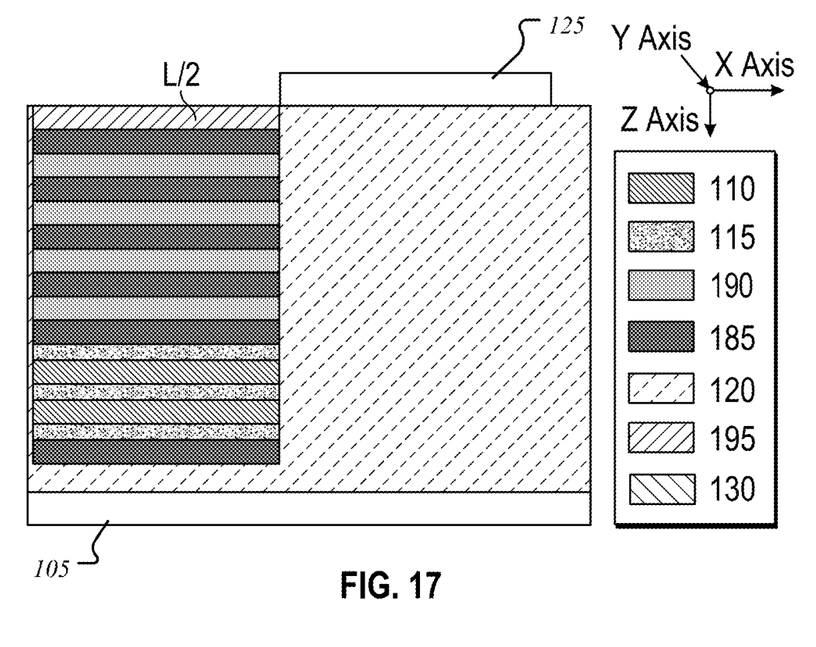
FIG. 17 is a cross-sectional front view of a substrate segment showing an example result of a stack of layers or nanolayers with an etch mask deposited, according to an embodiment of the present disclosure.

FIG. 17 is a cross-sectional front view of the substrate 105 segment showing an example result of the stack 100 of layers or nanolayers with the etch mask 125 deposited, according to an embodiment of the present disclosure. In an embodiment, the etch mask 125 is formed to cover the previously uncovered portion of the nano-sheet stack 100. The unmasked side is then etched to remove the oxide 120 and uncover the layers in the stack 100. Subsequent processing as previously described can then be repeated to remove the SiX4 110, deposit the metal 130 (and align metal 130 edge with stack 100 edge), remove the SiX5 115, and deposit the oxide 120 to isolate the metal 130 lines.

Figure 18:
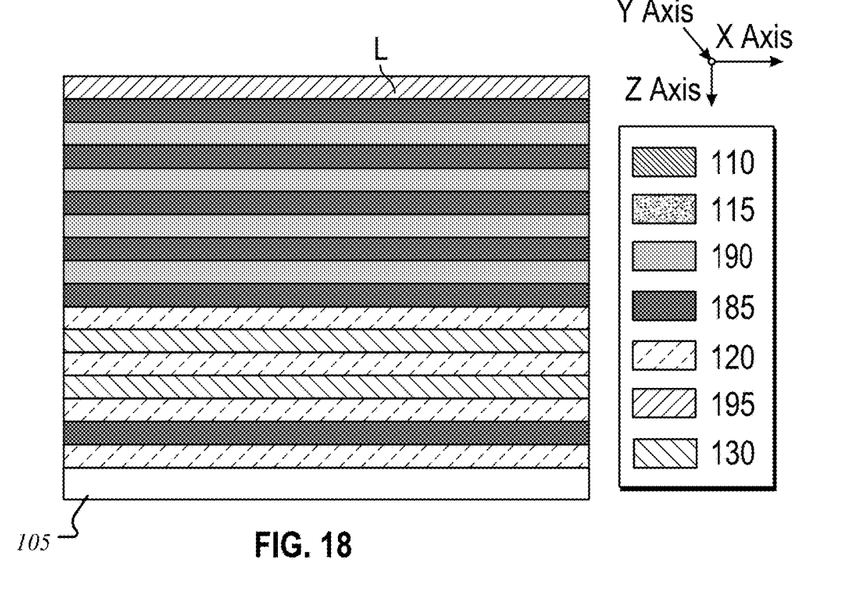
FIG. 18 is a cross-sectional front view of a finished stack, according to an embodiment of the present disclosure.
Figure 19:
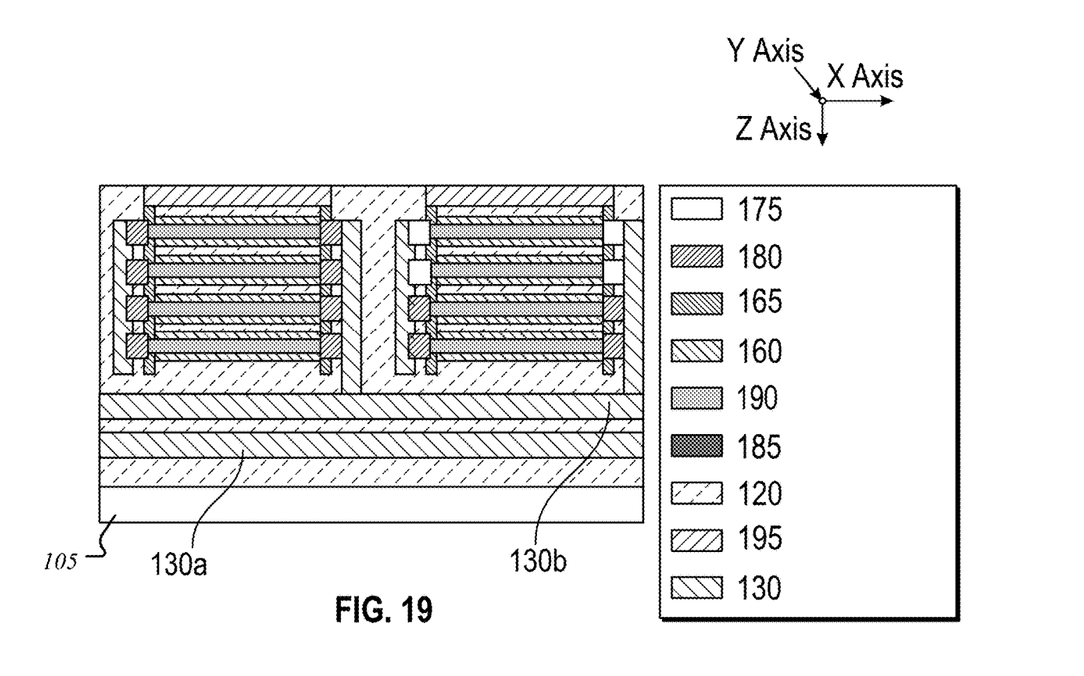
FIG. 19 is a cross-sectional front view of a finished stack after completing transistor formation steps, according to an embodiment of the present disclosure.

FIG. 18 is a cross-sectional front view of the finished stack 100, according to an embodiment of the present disclosure. FIG. 19 is a cross-sectional front view of the finished stack 100 after completing transistor formation steps, according to an embodiment of the present disclosure. In an embodiment, the stack 100 can be trimmed and further processed to deposit buried power rails (power rails disposed below active devices and/or in bulk silicon) and corresponding connections as well as other features. As shown, there are two metal 130 lines underneath the nano-sheet stack 100 with four silicon planes. For example, a first of the metal 130 lines can be a ground metal line 130a and a second of the metal 130 lines can be a VDD metal line 130b. The finished stack 100 can also include PMOS Source/Drain regions 175, NMOS Source/Drain regions 180, a plurality of spacers 165, and a plurality of metal gates 160. Note that the role of the ground metal line 130a and the VDD metal line 130b may be varied for NMOS and PMOS and interchanging role of symmetrical Source and Drain depending on circuit requirements.

Figure 20:
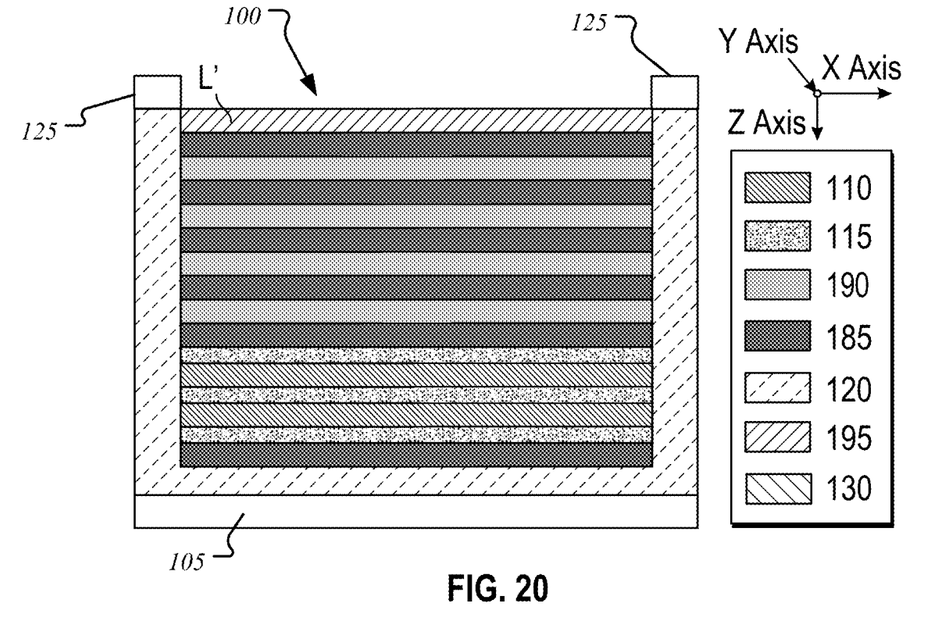
FIG. 20 is a cross-sectional front view of a substrate segment showing an example result of a stack of layers or nanolayers after a deposition of an oxide and removal of a middle portion, according to an embodiment of the present disclosure.

In an alternative embodiment, the stack 100 can be covered with the oxide 120 and a middle portion of the stack 100 having a length L' can be unmasked and the oxide 120 can be removed in the middle portion. FIG. 20 is a cross-sectional front view of the substrate 105 segment showing an example result of the stack 100 of layers or nanolayers after a deposition of the oxide 120 and removal of the middle portion, according to an embodiment of the present disclosure. After deposition of the oxide 120, the oxide 120 can be planarized via CMP. As shown, the etch mask 125 can be formed on both sides of the stack 100. The unmasked middle portion can be etched to reveal the layers of the stack 100 having the length L'. The length L' can be any predetermined length up to a length that can result in cantilever effects and stiction. Notably, by having two supports on either end of the "bridge" shape formed by removing material in the middle portion of the stack 100, the length L' can be longer than the length L. After desired layer etching and filling, an etch can be performed to remove the two supports of the bridge on the ends of the stack 100.

Figure 21:
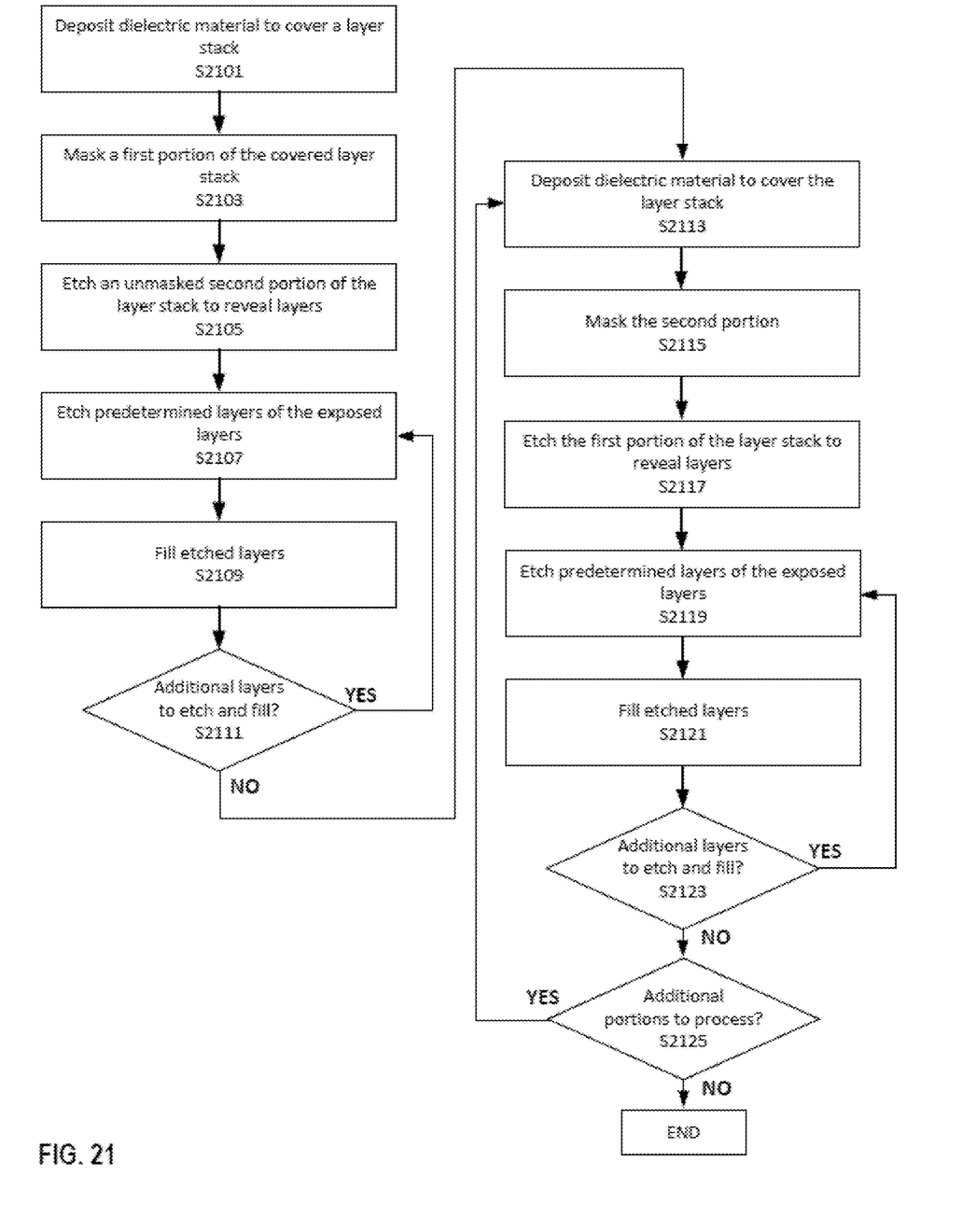
FIG. 21 is a flow chart for a method of fabricating a semiconductor device from a stack of layers or nanolayers, according to an embodiment of the present disclosure.

FIG. 21 is a flow chart for a method of fabricating a semiconductor device from the stack 100, according to an embodiment of the present disclosure. In step S2101, the oxide 120 (or any dielectric fill) is deposited to cover the layer stack 100. In step S2103, a first portion of the layer stack 100 is masked with the etch mask 125. This portion will be protected from etching and processing during the first processing cycle. An optional CMP can also be performed to planarize the oxide 120. In step S2105, a second portion that is unmasked is etched to remove the oxide 120 and uncover the layers of the stack 100. In step S2107, the desired layers of the stack 100 are etched. For example, the SiX4 110 layers can be etched. In step S2109, the previously etched and removed layers are filled and replaced with a desired material. For Example, the SiX4 110 layers that were removed can be replaced with the metal 130. In step S2111, if additional layers can be targeted for etching, the method can return to step S2107. For example, the SiX5 115 layers can be etched and the method can return to step S2107 to etch the SiX5 115 layers. If all desired layers for the second portion have been etched, the method can proceed to step S2113. In step S2113, the oxide 120 (or any dielectric fill) is deposited over the stack 100. The previously masked first portion can be targeted for processing. Thus, in step S2115, the etch mask 125 can be formed over the second portion, leaving the first portion unmasked. An optional CMP can also be performed to planarize the oxide 120. In step S2117, the first portion is etched to remove the oxide 120 and uncover the layers of the stack 100. In step S2119, the desired layers of the stack 100 are etched. For example, the SiX4 110 layers can be etched. In step S2121, the previously etched and removed layers are filled and replaced with a desired material. For Example, the SiX4 110 layers that were removed can be replaced with the metal 130. In step S2123, if additional layers can be targeted for etching, the method can return to step S2119. For example, the SiX5 115 layers can be etched and the method can return to step S2119 to etch the SiX5 115 layers. If all desired layers for the second portion have been etched, the method can proceed to step S2125. If additional portions of the stack 100 were masked and have not been etched, the method can return to step S2113 where the processed (previously unmasked, etched, and filled) portions are masked and the remaining portions that can be processed are left unmasked and iteratively processed. For example, the stack 100 can be split into three portions instead of two (wherein the length is L/3 instead of L/2), and the stack 100 can be processed three time—once for each portion. In step S2125, if all portions have been processed, the method ends.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a substrate;
an oxide layer deposited on the substrate;
a multilayer stack formed on top of the oxide layer, the multilayer stack including an elongated geometry along a length dimension and perpendicular to a vertical direction, a width dimension perpendicular to the vertical direction and the length dimension, and at least four materials,
a vertically lower portion of the multilayer stack including at least one layer of a first material in contact and alternating with at least two layers of a second material,
a vertically upper portion of the multilayer stack including at least one layer of a third material in contact and alternating with at least two layers of a fourth material, each of the at least four materials having a different etch resistivity relative to each other; and a nitride cap formed on top of the multilayer stack.

2. The semiconductor device of claim 1, wherein the multilayer stack includes multiple layers of the first material in the lower portion that alternate with multiple layers of the second material.

3. The semiconductor device of claim 1, wherein the second material is a dielectric material.

4. The semiconductor device of claim 1, wherein the multilayer stack is formed by epitaxial growth.

5. The semiconductor device of claim 1, wherein the third material is silicon and the fourth material is $SiGe_2$.

6. The semiconductor device of claim 1, wherein the third material is silicon and the fourth material is an oxide.

7. The semiconductor device of claim 1, further comprising a metal gate surrounding each layer of the at least one layer of the third material.

8. The semiconductor device of claim 1, wherein the first material is a conductor.

9. The semiconductor device of claim 8, wherein the conductor is ruthenium (Ru).

10. The semiconductor device of claim 8, wherein the second material is an oxide filled between each layer of the at least one layer of the first material.

11. The semiconductor device of claim 8, further comprising source and drain regions formed at either end of channels formed by the at least one layer of the third material in the upper portion.

12. The semiconductor device of claim 11, wherein the lower portion includes two layers of the conductor comprising metal lines connected to the source and drain regions disposed at either end of the channels formed by the third material in the upper portion.

13. A semiconductor device, comprising:

a substrate;

an oxide layer deposited on the substrate;

a multilayer stack formed on top of the oxide layer, the multilayer stack including an elongated geometry along a length dimension and perpendicular to a vertical direction, a width dimension perpendicular to the vertical direction and the length dimension, and at least four materials, a lower portion including at least two layers of a conductor material in contact and alternating with at least one layer of a second material, an upper portion including at least one layer of a third material in contact and alternating with at least one layer of a fourth material, each of the at least four materials having a different etch resistivity relative to each other;

a nitride cap formed on top of the multilayer stack, and source and drain regions formed at either end of channels formed by the at least one layer of the third material in the upper portion, the at least two layers of the conductor material comprising metal lines connected to the source and drain regions.

* * * * *